(12) United States Patent
Srivastava et al.

(10) Patent No.: US 10,347,347 B1
(45) Date of Patent: Jul. 9, 2019

(54) LINK TRAINING MECHANISM BY CONTROLLING DELAY IN DATA PATH

(71) Applicant: Intel Corporation, Santa Clara, CA (US)

(72) Inventors: Amit Kumar Srivastava, Folsom, CA (US); Sriram Balasubrahmanyam, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/845,683

(22) Filed: Dec. 18, 2017

(51) Int. Cl.
*G11C 16/32* (2006.01)
*G11C 7/22* (2006.01)

(52) U.S. Cl.
CPC ............... *G11C 16/32* (2013.01); *G11C 7/22* (2013.01)

(58) Field of Classification Search
CPC ..... G11C 16/32; G11C 7/225; G11C 11/4076; G11C 7/22; G11C 2207/2254; G06F 3/0416
See application file for complete search history.

(56) References Cited

U.S. PATENT DOCUMENTS

| | | | |
|---|---|---|---|
| 8,228,747 B2 * | 7/2012 | Onishi ................ | G11C 7/1066 365/191 |
| 2013/0064025 A1 * | 3/2013 | Chen .................. | G06F 13/1689 365/193 |
| 2017/0329535 A1 * | 11/2017 | Jeon ........................ | G11C 8/18 |

* cited by examiner

*Primary Examiner* — David Lam
(74) *Attorney, Agent, or Firm* — Green, Howard & Mughal, LLP

(57) ABSTRACT

An apparatus is provided which comprises: a buffer to receive first data from a host, and output the first data with configurable delay; and one or more circuitries to: compare the first data from the host with second data that is accessible to the apparatus, wherein the second data is substantially a copy of the first data, and calibrate the delay of the buffer, based at least in part on the comparison of the first data and the second data.

20 Claims, 9 Drawing Sheets

LINK TRAINING MECHANISM BY CONTROLLING DELAY IN DATA PATH

BACKGROUND

Modern memory devices (e.g., flash memory devices such as NAND flash memory, NOR flash memory, or another appropriate memory device)) are operating at increasingly high speed, e.g., at 800 Mega-transfers per second (MT/s). Future memory devices (e.g., flash memory devices) may operate at even higher speed, e.g., as high as 1600 MT/s, or even more than 1600 MT/s. At such high operating speed, a memory device may suffer timing loss between the memory device and a host. If the host is coupled to one or more memory devices via an interfacing circuitry (e.g., in order to have relatively larger storage capacity), such interfacing circuitry may also suffer from the severe timing loss due to the high operating speed, and may not be able to sustain higher speed operations.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
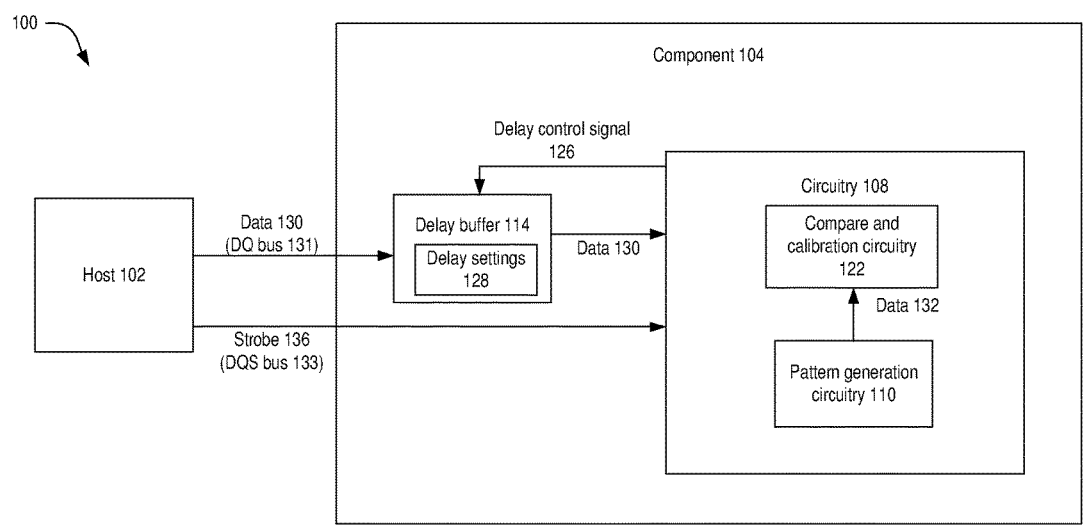
FIG. 1 schematically illustrates a system comprising a host communicating with a component, where the component is to calibrate delay setting of a delay buffer that is to receive data from the host, according to some embodiments.

Modern and future storage devices are to operate at increasingly high speed, e.g., as high as 1600 MT/s, or even more. At such high operating speed, a system may suffer timing loss between the storage device and a host, which may result in reduction in the operating frequency. To overcome such a timing loss, a link from the host to the storage device may need to be trained for synchronization purposes, e.g., to improve the operating frequency by mitigating the signal losses while operating at relative high speed.

In some embodiments, a memory may receive data from a host over a data bus, and receive a strobe signal over a strobe bus. The strobe signal may be used to sample the received data. In some embodiments, to ensure synchronization and to enable the memory device to correctly retrieve the data from the host, a component associated with the memory may selectively delay the reception of the data (e.g., using a delay buffer).

For example, the component may receive first data from the host, and may generate second data. In an example, the first data received from the host and the second data generated by the component may be identical. The component may compare the first data and the second data, e.g., to determine a first delay and a second delay of the delay buffer respectively corresponding to a left data boundary and a right data boundary of an eye opening of the received data from the host. In some embodiments, based on the first and second delays, the component may select an optimal or near optimal delay for the delay buffer, e.g., with which data from the host may be delayed. Such a selected delay may provide an optimal or near optimal sampling point for the received data, which may ensure proper sampling even at high clock speed. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 schematically illustrates a system 100 comprising a host 102 communicating with a component 104, where the component 104 is to calibrate delay setting 128 of a delay buffer 114 that is to receive data (e.g., data 130) from the host 102, according to some embodiments.

In some embodiments, the component 104 may be a memory module, a storage module, and/or the like. Merely as an example, the component 104 may be a flash memory, a NAND flash memory, a NAND memory, and/or the like (although the actual memory storage is not illustrated in FIG. 1 for purposes of illustrative clarity). In some embodiments, the component 104 may be a memory interface device interfacing between the host 102 and one or more memory devices (e.g., two or more memory devices that are arranged in a stack). In some embodiments, the component 104 may be a repeater device and/or a re-timer device between the host 102 and one or more memory devices (e.g., two or more memory devices that are arranged in a stack). Thus, the component 104 may be a memory device, or a device that facilitates communication between the host 102 and one or more memory devices. In some embodiments, the component 104 may be any appropriate device that may communicate with the host 102.

In some embodiments, one or more components of the component 104 illustrated in FIG. 1 (and also illustrated in FIG. 2) may be included in a physical layer (PHY) of the component 104. If, for example, the component 104 comprises a memory module (e.g., a NAND flash memory), the actual memory storage locations are not illustrated in FIG. 1 for purposes of illustrative clarity.

In some embodiments, the host 102 may be any appropriate device, e.g., a computing device, one or more processors, a network interface, a memory interface, a laptop, a smart phone, a desktop, an Internet of things (IOT), a tablet, an appropriate consumer electronic device, and/or any other appropriate host device. In some embodiments, the host 102 may be any appropriate host that may communicate with the component 104.

In some embodiments, the host 102 transmits data 130 over a data bus 131. The data bus 131 may also be referred to as a DQ bus. In some embodiments, the host 102 transmits strobe 136 to the component 104 over a strobe bus 133 (also referred to as DQS bus 133). The data 107a may also be referred to as DQ, and the strobe 136 may also be referred to as DQS. The strobe 136 may be a differential signal comprising a strobe signal and a strobe bar signal.

The component 104 may sample the data 130 using the strobe 136 (or using a clock signal generated from the strobe 136). For example, the strobe 136 may be indicative of a time during which a bit of the data 130 is to be sampled by the component 104. Thus, timing synchronization between the data 130 and the strobe 136 may be useful in optimal or near optimal sampling and decoding of the data 130 at the component 104. In some embodiments, the data 130 may also be referred to as calibration data or reference data, as the data 130 is used to set or calibrate timing synchronization between the DQ bus 131 and the DQS bus 133.

In some embodiments, the component 104 may comprise a delay buffer 114 (also referred to as buffer 114). The buffer 114 may receive the data 130, buffer the data 130, and output the data 130 to a circuitry 108. In an example, the buffer 114 may possibly impose a configurable (or programmable) delay between receiving the data 130, and outputting the data 130 to the circuitry 108.

In some embodiments, the delay imposed by the buffer 114 may be configurable or programmable by the circuitry 108, e.g., using a delay control signal 126 (also referred to as signal 126). For example, the buffer 114 has delay setting 128 that can set an amount of delay imposed by the buffer 114. The signal 126 may control or set the delay setting 128 of the buffer 114.

In some embodiments, the circuitry 108 may comprise a compare and calibration circuitry 122 (also referred to as circuitry 122). In some embodiments, the circuitry 108 may also comprise a pattern generation circuitry 110 (also referred to as generator 110) to generate data 132. The generator 110 may generate the data 132 such that the data 132 substantially matches the data 130, as will be discussed herein in further detail. Thus, in an example, the data 132 may be a replica of the data 130.

In some embodiments, the circuitry 122 may compare the data 130 and data 132. In an example, based on comparing the data 130 and data 132, the circuitry 122 may detect a left edge and a right edge of an eye opening in an eye diagram associated with the data 130. For example, the circuitry 122 may vary the signal 126 to select various values of the delay setting 128 of the buffer 114, e.g., to detect the left edge and the right edge of the eye opening in the eye diagram, as will be discussed herein in further detail.

In some embodiments, a first delay value of the delay setting 128 may correspond to the left edge, and a second delay value of the delay setting 128 may correspond to the right edge. In some embodiments, based on the first and second delay values, the circuitry 122 may select an appropriate delay value for the delay setting 128, where the selected delay value may provide an optimal or near optimal sampling point of the data transmitted over the DQ bus 131, as will be discussed herein in further detail.

Figure 2:
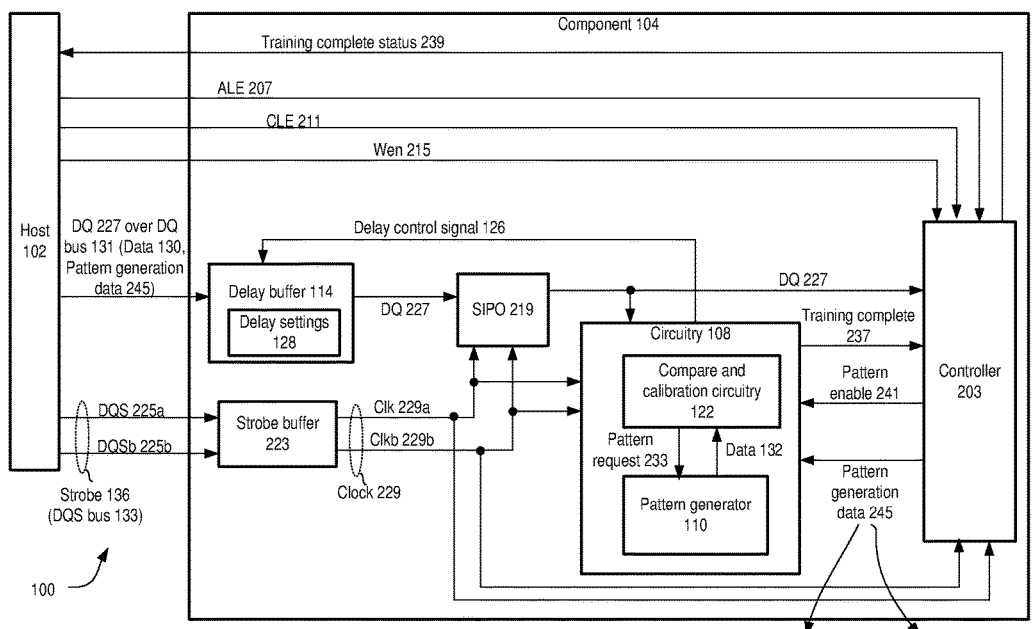
FIG. 2 illustrates further details of the component of FIG. 1, according to some embodiments.

FIG. 2 illustrates further details of the component 104 of FIG. 1, according to some embodiments. For example, FIG. 2 illustrates components of the component 104 that were not illustrated in FIG. 1 for purposes of illustrative clarity.

In some embodiments, the component 104 comprises a controller 203. The controller 203 may be, for example, a memory controller, or another appropriate controller of the component 104. The controller 203 may receive address latch enable (ALE) signal 207 (e.g., also referred to as ALE 207), command latch enable (CLE) signal 211 (e.g., also referred to as CLE 211), and write enable (Wen) signal 215 (e.g., also referred to as Wen 215) from the host 102. The ALE 207, the CLE 211, and/or the Wen 215 may facilitate writing data to a memory included in, or coupled to, the component 104 (e.g., coupled to the controller 203), and may also facilitate training of the DQ bus 131, as will be discussed herein in further detail.

In some embodiments, the component 104 may receive data from the host 102 in the form of DQ signal 227 (also referred to as DQ 227). For example, the DQ 227 comprises the data 130, e.g., as discussed with respect to FIG. 1. In some embodiments, the DQ 227 further comprises pattern generation data 245, which may be used by the generator 110 to generator the data pattern 132, as will be discussed in further detail herein. In an example, the DQ 227 may further comprise any appropriate data transmitted from the host 120 to the component 104. In some embodiments and as discussed with respect to FIG. 1, the buffer 114 may receive the DQ 227 from the host 102, and may output the DQ 227 after a configurable (or programmable) delay, where the delay may be based on the delay setting 128.

In some embodiments, the output (e.g., possibly the delayed output) of the buffer 114 may be received by a Serial-In Parallel-Out circuitry 219 (also referred to as SIPO 219), e.g., if the DQ 227 is received over a serial bus from the host 120 to the component 104. The SIPO 219 may convert the DQ 227 from a serial format to a parallel format, e.g., output the DQ 227 in a parallel format. The DQ 227 (e.g., in the parallel format) is received by the circuitry 108 and/or by the controller 203.

In some embodiments, the component 104 may also receive the strobe signal 136 in a strobe buffer 223 (also referred to as buffer 223). If, for example, the strobe 136 is a differential signal pair, DQS 225a and DQSb 225b may form the strobe 136. The buffer 223 may output differential pair of clock signals clk 229a and clk 229b, also referred to herein as clock 229. The clock 229 may be received by the SIPO 219, the circuitry 108 and/or the controller 203. In some embodiments, the clock 229 may be divided by an integer (e.g., divided by 4, to reduce a frequency of the clock 229), before a component of the component 104 receives the clock 229, although such division is not illustrated in FIG. 2.

In some embodiments and as also alluded to with reference to FIG. 1, the DQ 227 may be sampled in the controller 203 and/or in the circuitry 108. For example, the sampling of the DQ 227 may be performed using the strobe 136, or a clock derived from the strobe 136. For example, the clock 229 (e.g., which is derived from the strobe 136) may be received by the controller 203 and the circuitry 108, and these components may sample the DQ 227 based on the clock 229. In order to sample the DQ 227 in an optimal or near optimal manner (e.g., such that the sampling occurs at about a mid-point of an eye opening of an eye diagram of the DQ 227), the circuitry 108 performs a time synchronization of the DQ 227 with the strobe 136, e.g., by adjusting the delay setting 128 of the buffer 114. The time synchronization of the DQ 227 relative to the strobe 136, e.g., by adjusting the delay setting 128 of the buffer 114, is also referred to herein as training the link DQ 227.

In some embodiments, in order to perform the link training of the DQ bus 131, the generator 110 generates the data 132, which may be a copy of the data 130. For example, the host 102 may transmit the pattern generation data 245 (e.g., as a part of the DQ 227), e.g., before transmitting the data 130. In some embodiments, the circuitry 108 may receive the pattern generation data 245 directly from the SIPO 219 (e.g., by bypassing the controller 203), and/or from the SIPO 219 via the controller 203. The pattern generation data 245 may comprise two parts: pattern function bits 245a, and pattern data bits 245b. In an example, the pattern function bits 245a may also be referred to as mask bits, and the pattern data bits 245b may also be referred to as data bits for generating the data pattern 132.

In some embodiments, based on the pattern function bits 245a and pattern data bits 245b, the generator 110 may generate the data 132. For example, the data 130 may be pseudo-random data, and the pattern function bits 245a and pattern data bits 245b may be used, in combination, to uniquely generate the data 130 (or the data 132, which may be same as the data 132). In some sense, the pattern function bits 245a and pattern data bits 245b may be considered as a seed number or reference number used to generate the data 132. When the host 102 knows that the host 102 is about to transmit the data 130, the host 102 may, in advance, transmit the pattern function bits 245a and pattern data bits 245b to the circuitry 110. When the component 104 is to receive the data 130, the circuitry 122 may transmit a pattern request 233 to the generator 110 (e.g., in response to receiving a pattern enable signal 241 from the controller 203). In response to the request 233, the generator 110 may generate the data 132, based on the pattern function bits 245a and pattern data bits 245b (e.g., such that the data 130 and the data 132 may match).

In some embodiments, when the circuitry 122 receives the data 130 from the host 102 and the data 132 from the generator 110, the circuitry 122 compares the data 130 and 132, and determines a left and a right edge of the eye opening of the DQ 227, as will be discussed in further details herein. Subsequently, the circuitry 122 may configure or program the delay setting 128 such that, for example, the sampling of the DQ 227 may be done at optimal or near optimal points.

Figure 3:
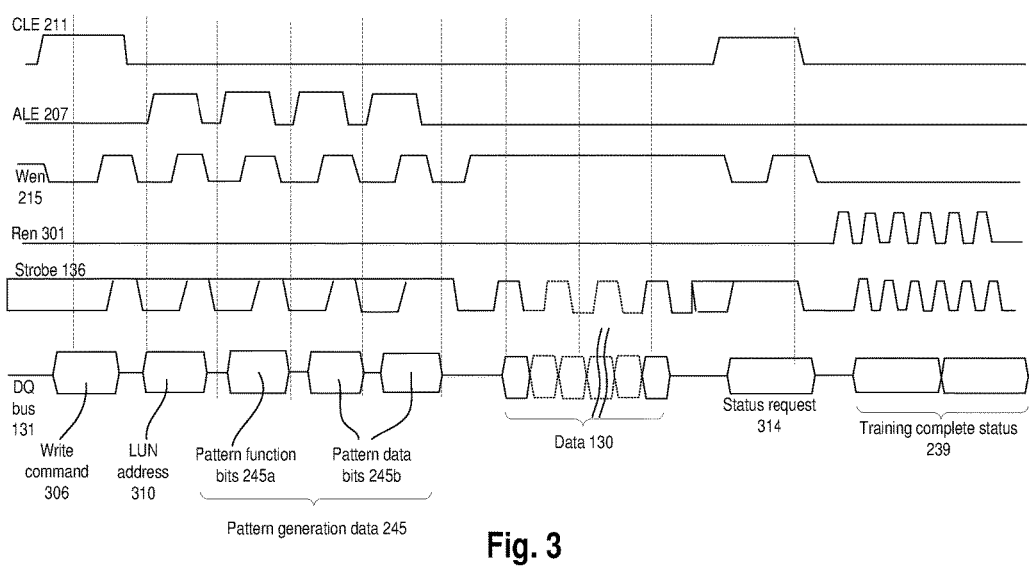
FIG. 3 illustrates a timing diagram depicting an example operation of the component of FIG. 1, according to some embodiments.
Figure 4:
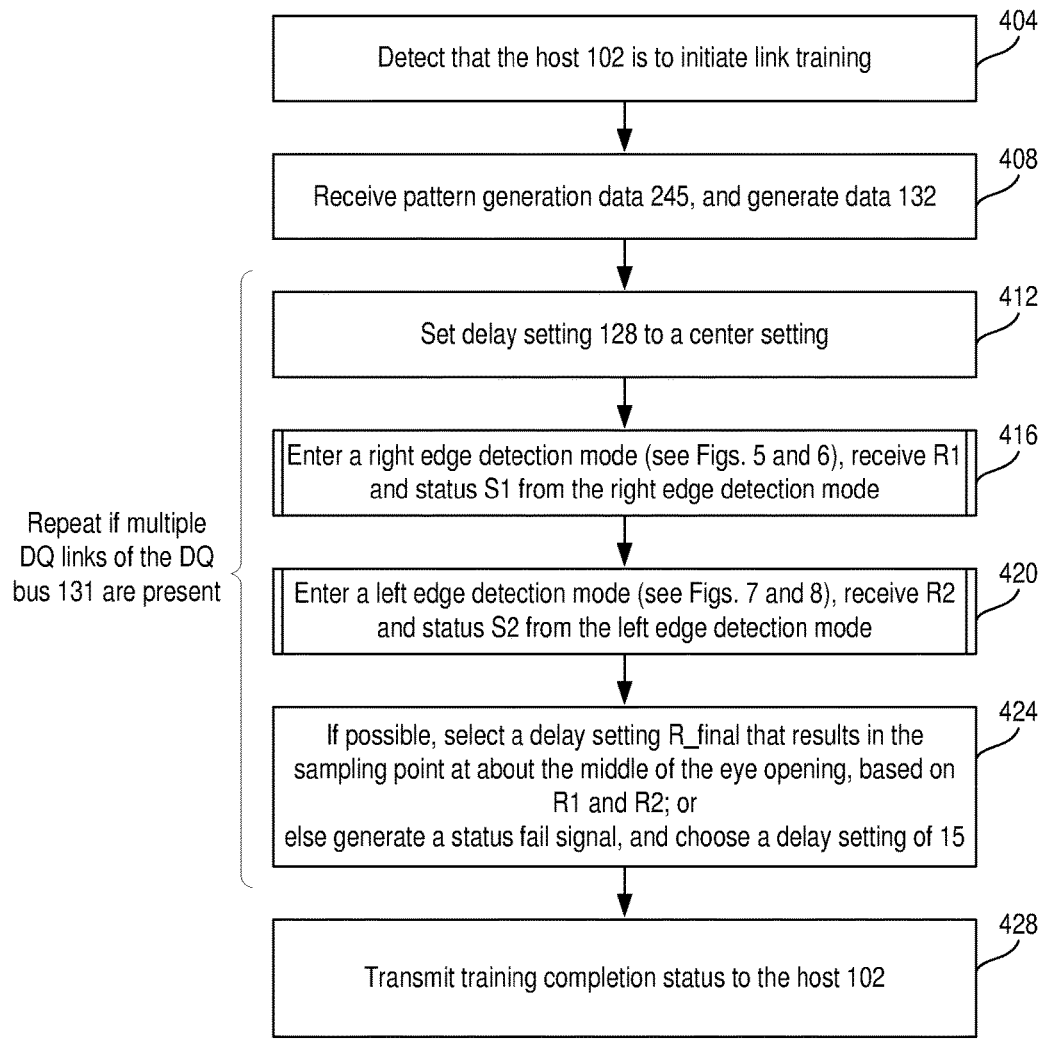
FIG. 4 illustrates a flowchart depicting a method for training a data link from the host to the component of FIG. 1, according to some embodiments.

The operation of the component 104 is illustrated using a timing diagram of FIG. 3. Also, FIG. 4 illustrates a flowchart depicting a method 400 for training the data bus DQ 131 from the host 102 to the component 104, according to some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 may be optional in accordance with certain embodiments. The numbering of the blocks presented is for the sake of clarity and is not intended to prescribe an order of operations in which the various blocks must occur.

Referring again to FIG. 3, in the illustrated timing diagram, signals CLE 211, ALE 207, Wen 215, Read enable (Ren) 301 (not illustrated in FIG. 2), strobe 135, and DQ 227 are illustrated. Initially (e.g., when the write enable Wen 215 is high), a write command 306 is transmitted over the DQ 227 by the host 102 to the component 104. The write command 306 is an indication to the component 104 that the host 102 wants to initiate a link training (e.g., to train the DQ bus 131). In some embodiments, the host 102 may also transmit a Logical Unit Number (LUN) address 310, which may provide further indication that the host 102 wants to initiate a link training.

Once the write command 306 and the LUN address 310 is transmitted over the DQ 227, the component 104 (e.g., the controller 203 and/or the circuitry 122) is aware that the host 102 is to transmit the pattern generation data 245. For example, the controller 203 may assert the pattern enable signal 241, e.g., to indicate to the circuitry 108 that the circuitry 108 is to receive the pattern generation data 245. For example, referring to FIG. 4, at 404, the component 104 (e.g., the controller 203 and/or the circuitry 108) may detect that the host 102 is to initiate link training.

As illustrated in FIG. 3, the host 102 then transmits the pattern generation data 245. As discussed herein previously, the pattern generation data 245 may be received by the circuitry 108 (e.g., by the generator 110) directly from the SIPO 219 (e.g., by bypassing the controller 203), and/or received from the SIPO 219 via the controller 203. In some embodiments, prior to, while, or subsequent to receiving the pattern generation data 245, the circuitry 122 may transmit the pattern request 233 to the generator 110.

In some embodiments, based on receiving the pattern generation data 245 and the pattern request 233, the generator 110 may generate the data 132. As previously discussed herein, the generator 110 may use the pattern generation data 245 (e.g., as a seed or reference) to generate the data 132. Merely as an example, the data 132 may be a mathematical function of the pattern generation data 245. In another example, the generator 110 may comprise a look-up table (LUT) comprising a plurality of candidate patterns, and the pattern generation data 245 may be a pointer that points to a specific pattern in the LUT—the generator 110 may output the specific pattern as the data 132.

For example, referring to FIG. 4, at 408, the component 104 (e.g., the generator 110) may receive the pattern generation data 245, and generate the data 132.

Referring again to FIG. 3, the host 102 may start transmitting the data 130. As illustrated in FIG. 3, a frequency or speed at which the data 130 is transmitted may be higher than a frequency or speed at which the write command 306, the LUN address 310, and the pattern generation data 245 are transmitted. Thus, for example, the write command 306, the LUN address 310, and the pattern generation data 245 may be received at relatively slower speed. In an example, as the write command 306, the LUN address 310, and the pattern generation data 245 are received at slower speed, the host 102 may be able to correctly sample and detect these signals (e.g., prior to commencing and completing the link training process for the DQ bus 131).

In some embodiments, once the component 104 (e.g., circuitry 122) starts receiving the data 130, the circuitry 122 commences the link training process, e.g., by varying the delay setting 128 (e.g., to select an optimal or near optimal value for the delay setting 128). For example, referring to FIG. 4, prior to the start of the link training process, at 412, the circuitry 122 may set a center value or a midrange value for the delay setting 128.

Merely as an example, assume that the delay setting 128 may range from 0 to 31, where a value of 0 would imply no or minimum delay imposed by the buffer 114, and a value of 31 would imply a maximum permissible delay imposed by the buffer 114. In an example, the delay imposed by the buffer 114 may increase linearly or near linearly (or non-linearly) with an increase in the delay setting 128. At 412, a mid-value within the range of 0 to 31, e.g., a value of 15 may be set for the delay setting 128 (e.g., by the circuitry 122).

Figure 5:
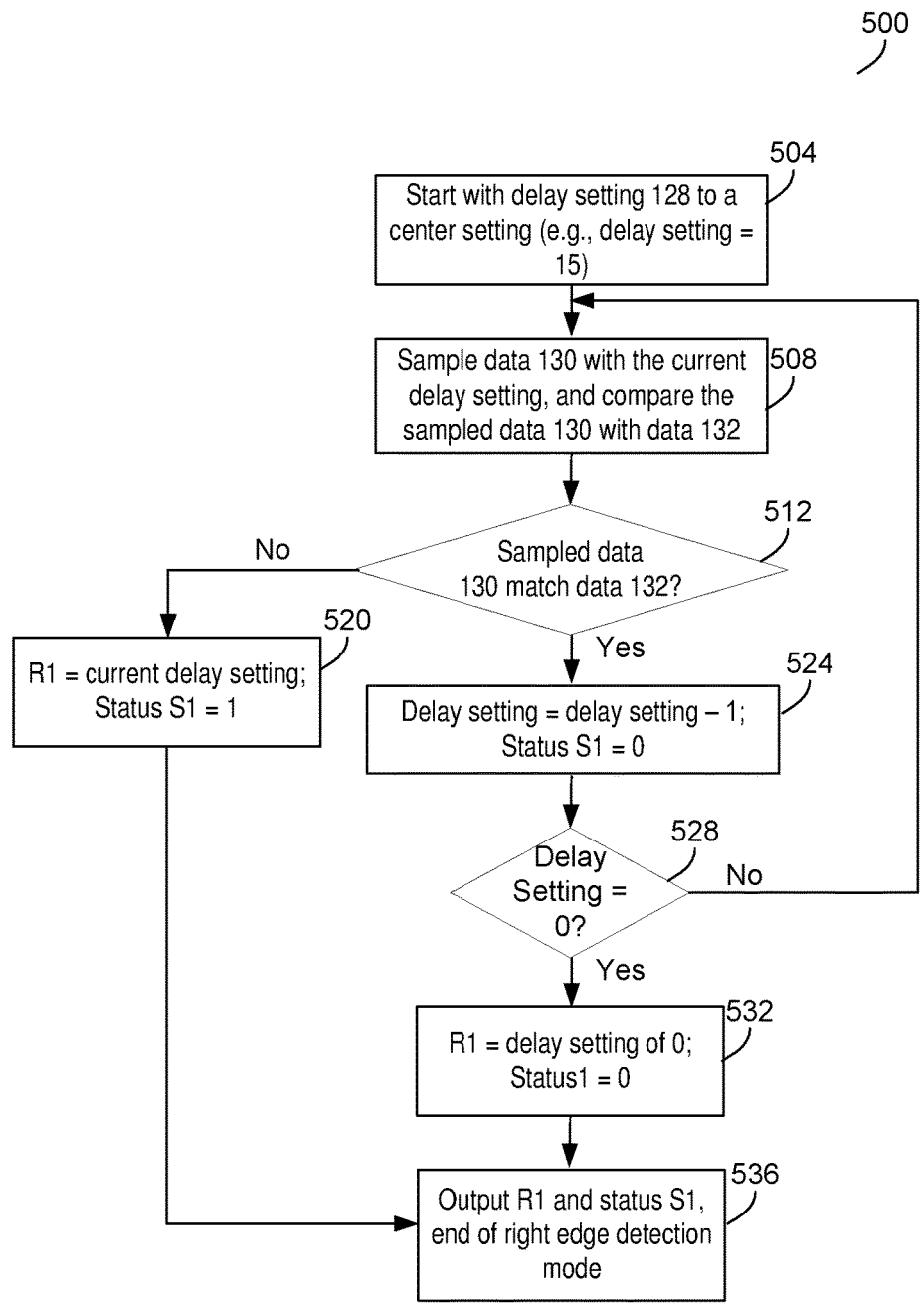
FIG. 5 illustrates a flowchart depicting a method for a right edge detection of an eye opening of an eye diagram, according to some embodiments.
Figure 6:
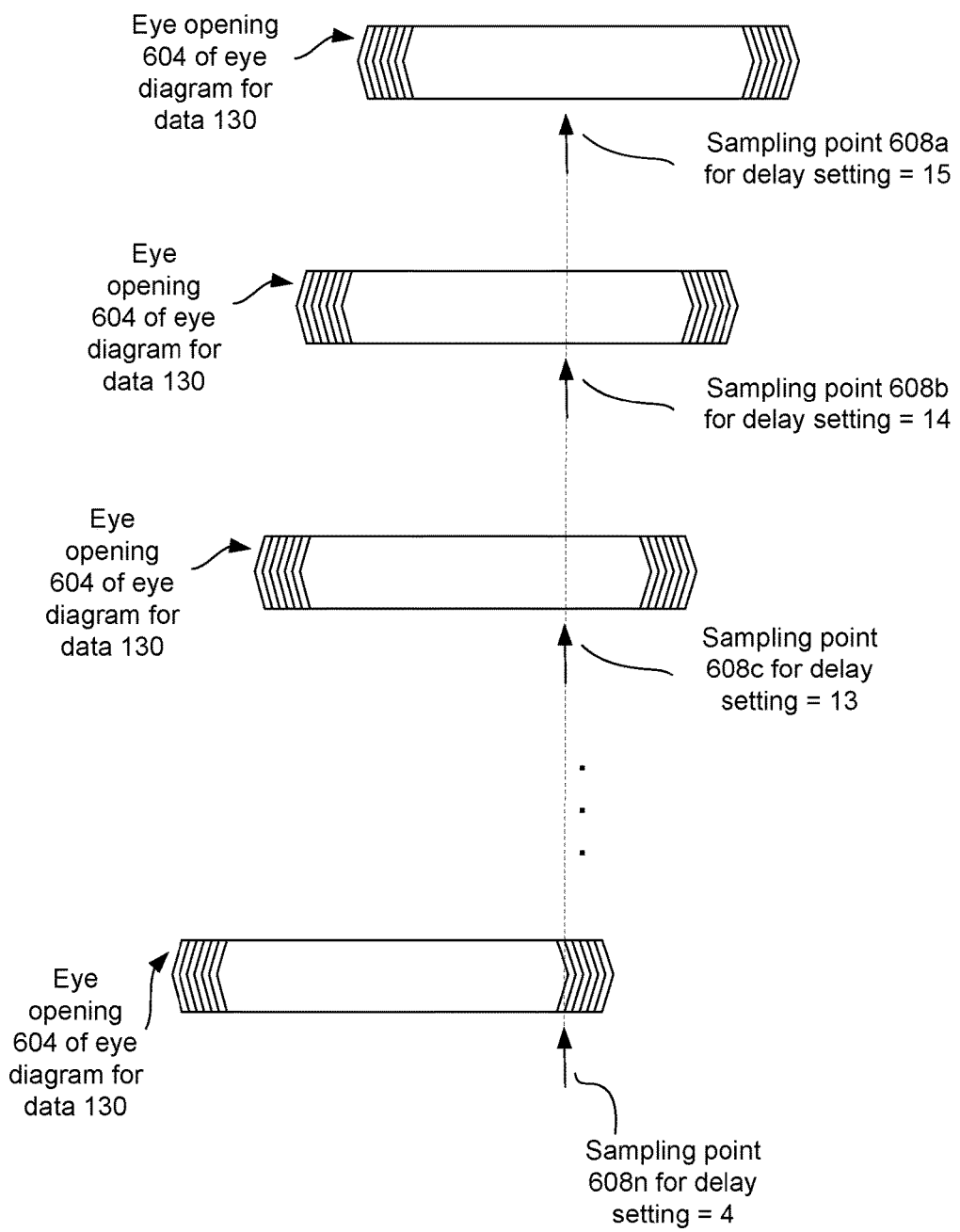
FIG. 6 illustrates an eye opening of the eye diagram, and also illustrates example changes of a sampling point with respect to the eye opening as a delay setting of a delay buffer is gradually decremented, according to some embodiments.

At 416, the circuitry 122 may enter a right edge detection mode, which is discussed with respect to in FIGS. 5 and 6. The output of the right edge detection mode is a delay value R1 and status S1.

FIG. 5 illustrates a flowchart depicting a method 500 for a right edge detection of an eye opening of an eye diagram of the DQ 227, according to some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 may be optional in accordance with certain embodiments. The numbering of the blocks presented is for the sake of clarity and is not intended to prescribe an order of operations in which the various blocks must occur.

As discussed with respect to FIG. 4, at 416, the component 104 may enter in a right edge detection mode, and operate in accordance with the method 500 of FIG. 5. Referring now to FIG. 5, the method 500 commences at 504, where the right edge detection mode may start with a delay setting 128 selected to about a center or mid-range delay setting (e.g., delay setting=15), as discussed with respect to 412 of FIG. 4.

FIG. 6 illustrates an eye opening 604 of the eye diagrams of the DQ 227, and also illustrates example changes of the sampling point with respect to the eye opening 604 as the delay setting 128 of the delay buffer 128 is gradually decremented, according to some embodiments. The eye diagrams of FIG. 6 are associated with sampling the data 130. For example, at 504 of the method 500, the delay setting may be set at 15. This may correspond to the sampling point 608a (e.g., at the top of FIG. 6) for the eye opening 604 of the data 130. As illustrated in FIG. 6, the sampling point 608a of the DQ 227 (e.g., performed by the circuitry 122) may occur within the eye opening 604 for the delay setting of 15, and hence, the data 130 is likely to be detected correctly.

At 508, the data 130 may be sampled with the current delay setting, which is 15. The sampled data may be then compared to the data 132 generated by the generator 110.

At 512, it may be determined if the sampled data 130 (e.g., sampled with the current delay setting) matches with the data 132 generated by the generator 110. As illustrated in FIG. 6, the sampling of the data 130 (e.g., with the current delay setting of 15) may occur within the eye opening 604, and hence, the data 130 is likely to be sampled correctly. Thus, the sampled data 130 may match with the data 132 generated by the generator 110 during the first iteration of the method 500 for the example eye opening 604 of FIG. 6.

If the two data matches (e.g., Yes at 512), the method 500 may proceed to 524, where the delay setting may be decremented, e.g., by one. Also, a status S1 may be set to 0. Thus, now the delay setting may be 14.

At 528, it may be checked if the delay setting has reached a minimum delay setting of 0. If "No" at 528, the method 500 may loop back to 508. For example, the operations at 508, 512, 524, and 528 may be iteratively repeated. During the second iteration of the operation at 508, the delay setting may be 14.

As the delay setting 14 corresponds to relatively less delay than the delay setting of 15, the second eye diagram from the top in FIG. 6 is shifted to the left compared to the top most eye diagram (e.g., assuming that the sampling point is the same in the two eye diagrams). Thus, for example, with the decrement in the delay setting, the eye opening 604 occurs earlier relative to the sampling point.

As illustrated in FIG. 6 (e.g., the second eye diagram from the top), the sampling of the data 130 with the delay setting of 14 may occur within the eye opening 604, and hence, the data 130 is likely to be detected correctly. Thus, the operations at 508, 512, 524, and 528 may be iteratively repeated once again.

After several iterations of the operations at 508, 512, 524, and 528, assume that the delay setting has decremented at 4. During such an iteration, as illustrate in the bottom most eye opening of FIG. 6, the sampling point 608n (e.g., for delay setting=4) may be about at about an edge or beyond the edge of the eye opening 604, thereby leading to erroneous sampling of one or more bits of the data 130. Thus, at 512, the sampled data 130 may not match with the data 132, and hence, "No" at 512. The method may then proceed to 520, where a value R1 may be equated to the current delay setting (e.g., delay setting of 4 in the example of FIG. 6). Also, a status S1 may be equated to 1. Subsequently, the method 500 may proceed to 536, where the method 500 may output the values of R1 and S1, and end the right edge detection mode.

Also, if "Yes" at 528, this situation may arise if, even for the lowest possible delay setting, the edge of the eye opening 604 is not reached. This may happen, for example, if the sampling for delay setting of 15 is highly skewed towards the left of the eye opening 604. If such a case, at 532, the value of R1 would be set to the minimum delay setting of 0, and the status S1 may be set to 0, and the method 500 may proceed to 536.

Thus, the method 500 outputs the delay setting of R1. In an example, R1 may be the delay setting at which the sampling occurs at the right edge of the eye opening 604. In another example, R1 is the minimum possible delay setting (e.g., if the right edge cannot be reached). Thus, the delay setting R1 is associated with a right edge of the eye opening 604, e.g., a right boundary or right edge of the data 130.

Also, the method 500 outputs the status S1. The status S1 is 1 if for the delay setting R1, the sampling occurs at the right edge of the eye opening 604. In another example, status S1 is 1 if the right edge cannot be reached even with the lowest possible delay setting.

Referring again to FIG. 4, at 416, the circuitry 108 may receive the delay setting R1 and the status S1 from the right edge detection mode operations of the method 500. Subsequently, the method 400 may proceed to 420, where the circuitry 108 may enter a left edge detection mode, as discussed with respect to FIGS. 7 and 8.

Figure 7:
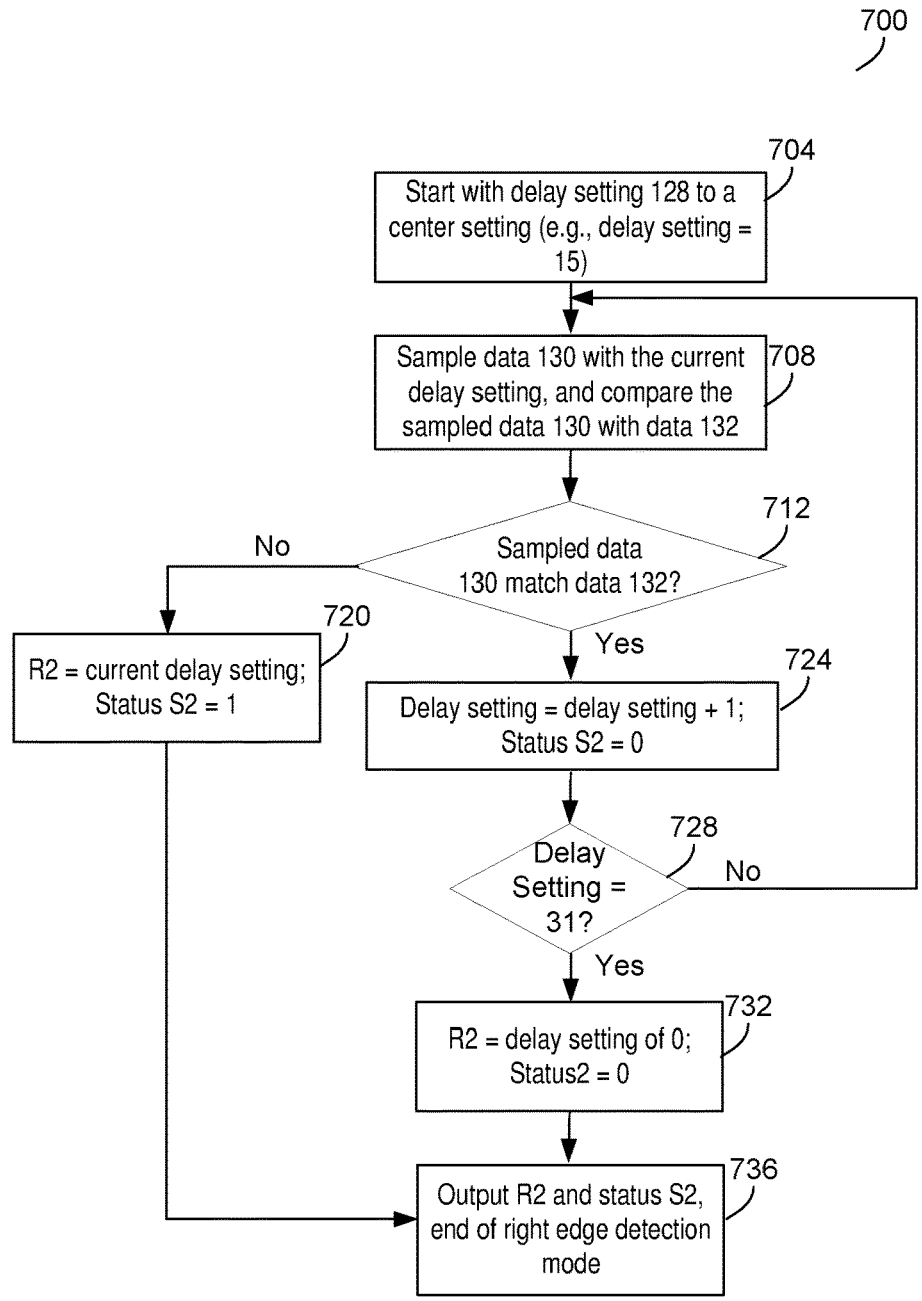
FIG. 7 illustrates a flowchart depicting a method for a left edge detection of an eye opening of an eye diagram, according to some embodiments.

FIG. 7 illustrates a flowchart depicting a method 700 for a left edge detection of an eye opening of an eye diagram of the data 130, according to some embodiments. Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 may be optional in accordance with certain embodiments. The numbering of the blocks presented is for the sake of clarity and is not intended to prescribe an order of operations in which the various blocks must occur.

The operations 704, . . . , 736 of the method 700 may be at least in part similar to the operations 504, . . . , 536 of the method 500 of FIG. 5. However, unlike the method 500 (e.g., unlike the operations at 528), in the method 700 the delay setting may be incremented at 728. Furthermore, unlike the method 500, at 728 of the method 700 the delay setting may be compared to a maximum possible delay setting of, for example, 31. Also, unlike the method 500, in the method 700 the output may be delay setting R2 and status S2.

Figure 8:
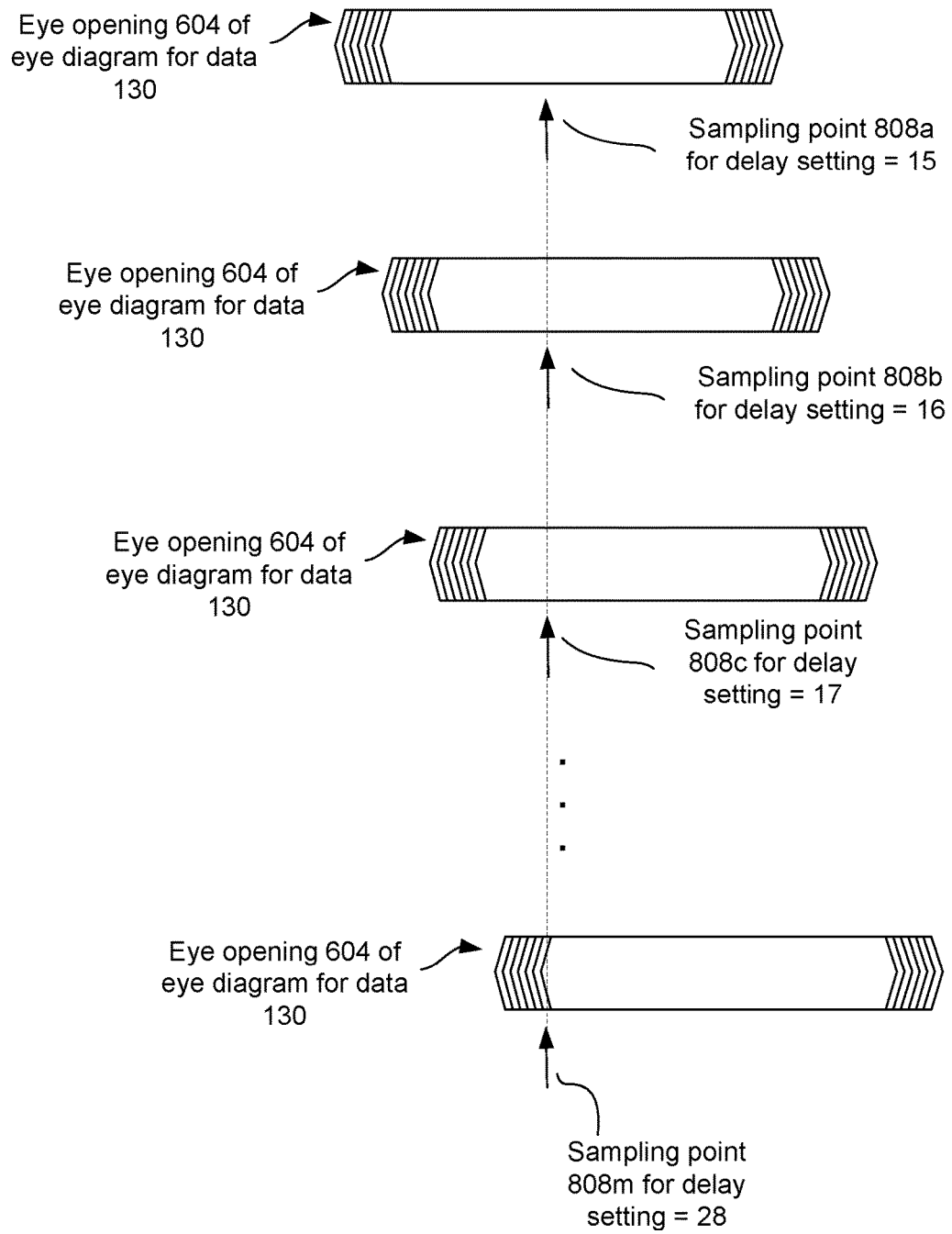
FIG. 8 illustrates an eye opening of the eye diagram, and also illustrates example changes of a sampling point with respect to the eye opening as a delay setting of a delay buffer is gradually incremented, according to some embodiments.

FIG. 8 illustrates an eye opening 604 of the eye diagram of the data 130, and also illustrates example changes of the sampling point with respect to the eye opening 604 as the delay setting 128 of the delay buffer 128 is gradually incremented, according to some embodiments. FIG. 8 may be at least in part similar to FIG. 6. However, unlike FIG. 6 where the sampling point moves towards the right edge of the eye opening 608 based on decrementing the delay setting, in FIG. 8 the sampling point moves towards the left edge of the eye opening 608 based on incrementing the delay setting.

As illustrated in FIG. 8, the sampling point 808m hits the left edge of the eye opening 604 for delay setting of 28. Thus, the output of the method 600 would be R2=delay setting of 28, and status S2=1.

The method 700 of FIG. 7 and the corresponding shift in the eye opening (e.g., as illustrated in FIG. 8) may be evident from the discussion with respect to FIGS. 5 and 6. Accordingly, FIGS. 7 and 8 will not be discussed in further details herein.

Referring again to FIG. 4, at 420, the circuitry 108 may receive the delay setting R2 and the status S2. Subsequently, the method 400 may proceed to 424, where, if possible, a delay setting R_final is selected that results in the sampling point to be at about the middle of the eye opening, based on R1 and R2. In some embodiments, the R_final may be at about a mid-point between the delay settings R1 and R2.

For example, R1 and R2 corresponding to FIGS. 6 and 8 are 4 and 28, respectively. Accordingly, in an example, R_final may be selected to be 16 (e.g., at or about a mid-point between 4 and 28). Thus, after the calibration or link training is over, the final delay setting 128 of the buffer 114 may be set to 28 (e.g., using the delay control signal 126). In some embodiments, a link training status pass may be generated.

In some situations, it may not be possible to generate the R_final from the values of R1 and R2. Merely as an example, the sampling point for all possible delay settings may be outside the eye opening. In another example, the timing of the DQ 227 may not match with the timing of the strobe 136, e.g., due to which the sampling point may shift within the eye opening even for a specific delay setting (e.g., due to a synchronization issue in the host 102). For example, the DQ 227 may be too fast, or too slow, e.g., relative to the strobe 136. In another example, the status S1 and/or S2 may be zero.

In situations where it may not be possible to generate the R_final from the values of R1 and R2, the R_final may be set to a mid-point of the possible range of delay settings 128, which may be 15 in the example discussed herein. So, at 424, if it is not possible to generate the R_final from the values of R1 and R2, a default value of 15 may be selected for the R_final. Also, a status fail signal may be generated.

In some embodiments, the DQ bus 131 from the host 102 to the component 104 may have two or more parallel links. For example, the DQ bus 131 may be an 8-bit bus. In such a case, the operations 412, . . . , 424 may be repeated for each of the links of the DQ bus 131. Thus, for each link of the DQ bus 131, these operations can be repeated such that a final delay setting R_final can be independently selected for each of the links. Thus, a plurality of R_final values may be selected for a corresponding plurality of the links of the DQ bus 131.

After repeating the operations 408, . . . , 424 for all the links of the DQ bus 131, the method 400 may proceed to 428, where a training completion status may be transmitted to the host 102. For example, FIG. 2 illustrates transmission of a training complete status 239 from the controller 203 to the host 102. FIG. 3 also illustrates transmission of the training complete status 239 to the host 102.

In some embodiments, if the training is successful (e.g., if the R_final is selected based on R1 and R2 at 424), the training completion status may indicate a successful training.

On the other hand, if R_final cannot be generated based on R1 and R2 (e.g., if a default setting of 15 is selected for the final delay setting) and a status fail is generated at 424 (e.g., indicating training failure), then the training completion status may indicate so. For example, the training completion status may indicate to the host 102 if, for example, the DQ 227 is too slow, or too fast, e.g., relative to the strobe 136. In such a case, the host 102 may generate or calibrate its internal timing, and adjust the transmission timing of the DQ 127 and/or the strobe 136. In an example, in the event of training failure, the link training of the method 400 may be repeated to retrain the DQ links.

In some embodiments, the method 400 comprising the operations 404, . . . , 428 of FIG. 4 illustrate a calibration or training of the DQ bus 131 transmitting data from the host 102 to the component 104. On the link training is complete, the host 102 may transmit user data over the DQ bus 131 during a course of normal operation of the component 104 (e.g., to write the data to one or more memory associated with the component 104).

In some embodiments, the link training of the method 500 may be repeated intermittently, at periodic or aperiodic intervals (e.g., every 10 minutes), during a boot up or after a reset of the host 102 and/or the component 104, if an error is encountered in the host 102 and/or the component 104, after an operating frequency of the host 102 and/or the component 104 is changed (e.g., changed from a relatively low frequency to a relatively high frequency), and/or at any appropriate time.

Figure 9:
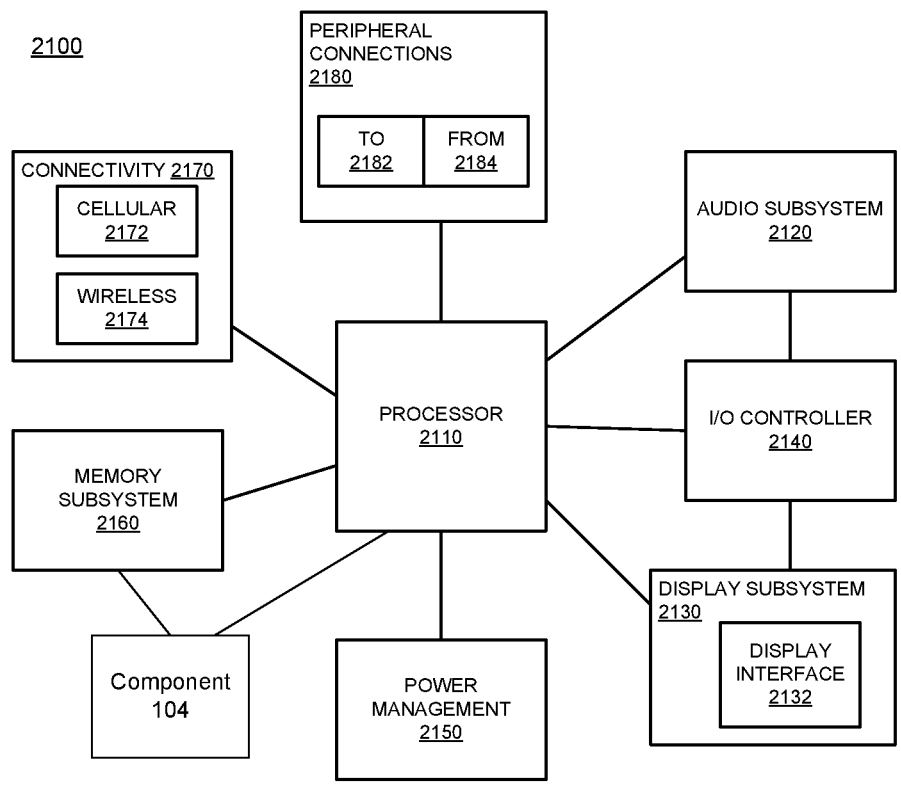
FIG. 9 illustrates a computer system, computing device or a SoC (System-on-Chip), where a component associated with a memory of the computing device is to train a data link from a host to the component, according to some embodiments.

FIG. 9 illustrates a computer system, computing device or a SoC (System-on-Chip) 2100, where a component (e.g., component 104) associated with a memory is to train a data link from a host (e.g., host 102) to the component, according to some embodiments. It is pointed out that those elements of FIG. 9 having the same reference numbers (or names) as the elements of any other figure can operate or function in any manner similar to that described, but are not limited to such.

In some embodiments, computing device 2100 represents an appropriate computing device, such as a computing tablet, a server, a workstation, a mobile phone or smartphone, a laptop, a desktop, an TOT device, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant. The processor 2110 may be a SoC or a computing unit.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise the component 104. For example, the processors 210 may be the host 102 of FIG. 1, and the component 104 may train a link between the processors 210 and a memory of the memory subsystem 2160, e.g., as discussed with respect to FIGS. 1-8.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a buffer to receive first data from a host, and output the first data with programmable delay; and one or more circuitries to: compare the first data from the host with second data that is accessible to the apparatus, wherein the second data is substantially a copy of the first data, and calibrate the delay of the buffer, based at least in part on the comparison of the first data and the second data.

Example 2

The apparatus of example 1 or any other example, wherein: the buffer is to receive pattern generation data from the host, prior to receiving the first data; and the apparatus comprises a pattern generator circuitry to generate the second data, based at least in part on the pattern generation data.

Example 3

The apparatus of example 2 or any other example, wherein: the buffer is to receive the pattern generation data from the host at a first clock speed and receive the first data from the host at a second clock speed; and the first clock speed is less than the second clock speed.

Example 4

The apparatus of any of examples 1-3 or any other example, wherein to calibrate the delay of the buffer, the one or more circuitries is to: sample the first data, with two or more of a plurality of candidate delay settings for the delay of the buffer, to respectively generate a plurality of sampled first data; and compare individual ones of the plurality of sampled first data with the second data to detect a left boundary and a right boundary of an eye opening of the first data.

Example 5

The apparatus of example 4, wherein to calibrate the delay of the buffer, the one or more circuitries is to: detect a first candidate delay setting that is used to generate a first sampled first data associated with the left boundary of the eye opening of the first data; detect a second candidate delay setting that is used to generate a second sampled first data associated with the right boundary of the eye opening of the first data; determine a final delay setting, based at least in part on the first candidate delay setting and the second candidate delay setting; and calibrate the delay of the buffer using the final delay setting.

Example 6

The apparatus of example 5 or any other example, wherein to detect the first candidate delay setting, the one or more circuitries is to: select a current delay setting from the plurality of candidate delay settings; (A) sample the first data, with the current delay settings for the delay of the buffer, to generate a current sampled first data; (B) compare the current sampled first data with the second data; (C) increment the current delay setting; and iteratively perform the operations of (A), (B), and (C), until the first compare detects a mismatch between the current sampled first data and the second data, wherein the first candidate delay setting generates the mismatch.

Example 7

The apparatus of example 5 or any other example, wherein to select the second candidate delay setting, the one or more circuitries is to: select a current delay setting from the plurality of candidate delay settings; (A) sample the first data, with the current delay settings for the delay of the buffer, to generate a current sampled first data; (B) compare the current sampled first data with the second data; (C) decrement the current delay setting; and iteratively perform the operations of (A), (B), and (C), until the first compare detects a mismatch between the current sampled first data and the second data, wherein the second candidate delay setting generates the mismatch.

Example 8

The apparatus of example 5 or any other example, wherein the final delay setting is an average of the first candidate delay setting and the second candidate delay setting.

Example 9

The apparatus of example 4 or any other example, wherein one or more circuitries are to sample the first data, based at least in part on a strobe signal received from the host.

Example 10

The apparatus of any of examples 1-3 or any other example, wherein the one or more circuitries are to transmit a confirmation to the host, upon completion of the calibration of the delay of the buffer.

Example 11

The apparatus of any of examples 1-3 or any other example, wherein: the buffer is to receive third data subsequent to the calibration of the delay of the buffer; and the apparatus comprises another one or more circuitries to write the third data is to a memory.

Example 12

The apparatus of example 11 or any other example, wherein the memory is a NAND flash memory that is included in, or coupled to, the apparatus.

Example 13

The apparatus of any of examples 1-3 or any other example, wherein the apparatus is one of: a NAND flash memory, an interface circuitry coupled between the host and one or more NAND flash memories, a repeater circuitry coupled between the host and one or more NAND flash memories, or a retimer circuitry coupled between the host and one or more NAND flash memories.

Example 14

A system comprising: a storage to store instructions; a processor to execute the instructions; a component to write to and read from the storage, wherein the component comprises: a buffer to receive first data and second data from the processor, and output the first data and the second data with programmable delay; a pattern generation circuitry to generate third data, based at least in part on the first data; a comparator circuitry to compare the second data and the third data; and a calibration circuitry to calibrate the delay of the buffer, based at least in part on the comparison of the second data and the third data; and a wireless interface to allow the processor to communicate with another device.

Example 15

The system of example 14 or any other example, wherein: the buffer is to receive the first data from the processor at a first clock speed and receive the second data from the processor at a second clock speed; and the first clock speed is less than the second clock speed.

Example 16

The system of example 14 or any other example, wherein the component further comprises: another buffer to receive strobe signal from the processor, wherein the component is to sample the second data based at least in part on the strobe signal.

Example 17

The system of any of examples 14-16 or any other example, wherein the storage is a NAND flash memory.

Example 18

Non-transitory computer-readable storage media to store instructions that, when executed by a processor, cause the processor to: receive pattern generation data from a host; generate first data, based on the pattern generation data; and set a delay setting of a buffer, based at least in part on comparing: the generated first data and second data received from the host via the buffer.

Example 19

The non-transitory computer-readable storage media of example 18 or any other example, wherein to set the delay setting of the buffer, the instructions cause the processor to: select a plurality of candidate delay settings for the buffer; for individual candidate delay setting, receive the second data via the buffer with the corresponding candidate delay setting set for the buffer, and sample the second data, such that a plurality of sampled second data is generated respectively corresponding to the plurality of candidate delay settings; select a first delay setting such that a corresponding first sampled second data is sampled at a first data edge boundary; and select a second delay setting such that a corresponding second sampled second data is sampled at a second data edge boundary.

Example 20

The non-transitory computer-readable storage media of example 19 or any other example, wherein to set the delay setting of the buffer, the instructions cause the processor to: determine a final delay setting to be about an average of the first delay setting and the second delay setting; and set the delay setting of the buffer to be equal to the final delay setting.

Example 21

A method comprising: receiving pattern generation data from a host; generating first data, based on the pattern generation data; and setting a delay setting of a buffer, based at least in part on comparing: the generated first data and second data received from the host via the buffer.

Example 22

The method of example 21 or any other example, wherein setting the delay setting of the buffer further comprises: selecting a plurality of candidate delay settings for the buffer; for individual candidate delay setting, receiving the second data via the buffer with the corresponding candidate delay setting set for the buffer, and sampling the second data, such that a plurality of sampled second data is generated respectively corresponding to the plurality of candidate delay settings; selecting a first delay setting such that a corresponding first sampled second data is sampled at a first data edge boundary; and selecting a second delay setting such that a corresponding second sampled second data is sampled at a second data edge boundary.

Example 23

The method of example 22 or any other example, wherein setting the delay setting of the buffer comprises: determining a final delay setting to be about an average of the first delay setting and the second delay setting; and setting the delay setting of the buffer to be equal to the final delay setting.

Example 24

An apparatus comprising: means for performing the method of any of the examples 21-23 or any other example.

Example 25

An apparatus comprising: means for receiving pattern generation data from a host; means for generating first data, based on the pattern generation data; and means for setting a delay setting of a buffer, based at least in part on comparing: the generated first data and second data received from the host via the buffer.

Example 26

The apparatus of example 25 or any other example, wherein the means for setting the delay setting of the buffer further comprises: means for selecting a plurality of candidate delay settings for the buffer; for individual candidate delay setting, means for receiving the second data via the buffer with the corresponding candidate delay setting set for the buffer, and means for sampling the second data, such that a plurality of sampled second data is generated respectively corresponding to the plurality of candidate delay settings; means for selecting a first delay setting such that a corresponding first sampled second data is sampled at a first data edge boundary; and means for selecting a second delay setting such that a corresponding second sampled second data is sampled at a second data edge boundary.

Example 27

The apparatus of example 26 or any other example, wherein the means for setting the delay setting of the buffer comprises: means for determining a final delay setting to be about an average of the first delay setting and the second delay setting; and means for setting the delay setting of the buffer to be equal to the final delay setting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a buffer to receive first data from a host, and output the first data with programmable delay; and
one or more circuitries to:
compare the first data from the host with second data that is accessible to the apparatus, wherein the second data is substantially a copy of the first data, and calibrate the delay of the buffer, based at least in part on the comparison of the first data and the second data.

2. The apparatus of claim 1, wherein:
the buffer is to receive pattern generation data from the host, prior to reception of the first data; and
the apparatus comprises a pattern generator circuitry to generate the second data, based at least in part on the pattern generation data.

3. The apparatus of claim 2, wherein:
the buffer is to receive the pattern generation data from the host at a first clock speed and is to receive the first data from the host at a second clock speed; and
the first clock speed is less than the second clock speed.

4. The apparatus of claim 1, wherein to calibrate the delay of the buffer, the one or more circuitries is to:
sample the first data, with two or more of a plurality of candidate delay settings for the delay of the buffer, to respectively generate a plurality of sampled first data; and
compare individual ones of the plurality of sampled first data with the second data to detect a left boundary and a right boundary of an eye opening of the first data.

5. The apparatus of claim 4, wherein to calibrate the delay of the buffer, the one or more circuitries is to:
detect a first candidate delay setting that is used to generate a first sampled first data associated with the left boundary of the eye opening of the first data;
detect a second candidate delay setting that is used to generate a second sampled first data associated with the right boundary of the eye opening of the first data;
determine a final delay setting, based at least in part on the first candidate delay setting and the second candidate delay setting; and
calibrate the delay of the buffer using the final delay setting.

6. The apparatus of claim 5, wherein to detect the first candidate delay setting, the one or more circuitries is to:
select a current delay setting from the plurality of candidate delay settings;
sample the first data, with the current delay settings for the delay of the buffer, to generate a current sampled first data;
compare the current sampled first data with the second data;
increment the current delay setting; and
iteratively perform the operations of sample, compare, and increment, until a first compare detects a mismatch between the current sampled first data and the second data,
wherein the first candidate delay setting generates the mismatch.

7. The apparatus of claim 5, wherein to select the second candidate delay setting, the one or more circuitries is to:
select a current delay setting from the plurality of candidate delay settings;
sample the first data, with the current delay settings for the delay of the buffer, to generate a current sampled first data;
compare the current sampled first data with the second data;
decrement the current delay setting; and
iteratively perform the operations of sample, compare, and decrement, until a first compare detects a mismatch between the current sampled first data and the second data,
wherein the second candidate delay setting generates the mismatch.

8. The apparatus of claim 5, wherein the final delay setting is an average of the first candidate delay setting and the second candidate delay setting.

9. The apparatus of claim 4, wherein the one or more circuitries are to sample the first data, based at least in part on a strobe signal received from the host.

10. The apparatus of claim 1, wherein the one or more circuitries are to transmit a confirmation to the host, upon completion of the calibration of the delay of the buffer.

11. The apparatus of claim 1, wherein:
the buffer is to receive third data subsequent to the calibration of the delay of the buffer;
wherein the one or more circuitries is a first one or more circuitries; and
the apparatus comprises a second one or more circuitries to write the third data is to a memory.

12. The apparatus of claim 11, wherein the memory is a NAND flash memory that is included in, or coupled to, the apparatus.

13. The apparatus of claim 1, wherein the apparatus is one of: a NAND flash memory, an interface circuitry coupled between the host and one or more NAND flash memories, a repeater circuitry coupled between the host and one or more NAND flash memories, or a retimer circuitry coupled between the host and one or more NAND flash memories.

14. A system comprising:
a storage to store instructions;
a processor to execute the instructions;
a component to write to and read from the storage, wherein the component comprises:
a buffer to receive first data and second data from the processor, and output the first data and the second data with programmable delay;
a pattern generation circuitry to generate third data, based at least in part on the first data;
a comparator circuitry to compare the second data and the third data; and
a calibration circuitry to calibrate the delay of the buffer, based at least in part on the comparison of the second data and the third data; and
a wireless interface to allow the processor to communicate with another device.

15. The system of claim 14, wherein:
the buffer is to receive the first data from the processor at a first clock speed and is to receive the second data from the processor at a second clock speed; and
the first clock speed is less than the second clock speed.

16. The system of claim 14, wherein the buffer is a first buffer, and wherein the component further comprises:
a second buffer to receive strobe signal from the processor,
wherein the component is to sample the second data based at least in part on the strobe signal.

17. The system of claim 14, wherein the storage is a NAND flash memory.

18. Non-transitory computer-readable storage media to store instructions that, when executed by a processor, cause the processor to:
receive pattern generation data from a host;
generate first data, based on the pattern generation data; and
set a delay setting of a buffer, based at least in part on comparing: the generated first data and second data received from the host via the buffer.

19. The non-transitory computer-readable storage media of claim 18, wherein to set the delay setting of the buffer, the instructions cause the processor to:

select a plurality of candidate delay settings for the buffer;

for individual candidate delay setting, receive the second data via the buffer with the corresponding candidate delay setting set for the buffer, and sample the second data, such that a plurality of sampled second data is generated respectively corresponding to the plurality of candidate delay settings;

select a first delay setting such that a corresponding first sampled second data is sampled at a first data edge boundary; and select a second delay setting such that a corresponding second sampled second data is sampled at a second data edge boundary.

20. The non-transitory computer-readable storage media of claim 19, wherein to set the delay setting of the buffer, the instructions cause the processor to:

determine a final delay setting to be about an average of the first delay setting and the second delay setting; and set the delay setting of the buffer to be equal to the final delay setting.

* * * * *